(12) United States Patent
Weindorf et al.

(10) Patent No.: US 7,193,828 B2
(45) Date of Patent: Mar. 20, 2007

(54) VIDEO PROTECTION CIRCUIT PROVIDING SHORT TO BATTERY PROTECTION WHILE MAINTAINING TERMINATION IMPEDANCE

(75) Inventors: Paul F. L. Weindorf, Novi, MI (US); Mark A. Leinonen, Livonia, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 615 days.

(21) Appl. No.: 10/659,836

(22) Filed: Sep. 11, 2003

(65) Prior Publication Data

US 2005/0057874 A1 Mar. 17, 2005

(51) Int. Cl.
*H02H 3/20* (2006.01)

(52) U.S. Cl. .................................................. 361/91.5
(58) Field of Classification Search ............... 361/91.5
See application file for complete search history.

(56) References Cited

U.S. PATENT DOCUMENTS

| | | | |
|---|---|---|---|
| 5,045,733 A * | 9/1991 | Sendelweck | 327/308 |
| 5,184,272 A | 2/1993 | Suda et al. | |
| 5,410,441 A | 4/1995 | Allman | |
| 5,459,357 A | 10/1995 | Minks | |
| 5,500,546 A * | 3/1996 | Marum et al. | 257/358 |
| 5,539,610 A | 7/1996 | Williams et al. | |
| 5,684,663 A | 11/1997 | Mitter | |
| 5,696,658 A | 12/1997 | Pietrobon | |
| 5,716,323 A * | 2/1998 | Lee | 600/134 |
| 6,154,009 A | 11/2000 | Fujita et al. | |
| 6,166,451 A | 12/2000 | Pigott | |
| 6,297,619 B1 | 10/2001 | Terada | |
| 6,426,857 B1 | 7/2002 | Doster et al. | |
| 6,429,550 B1 | 8/2002 | Braun et al. | |
| 6,548,916 B1 | 4/2003 | Kanazawa et al. | |

FOREIGN PATENT DOCUMENTS

| | | |
|---|---|---|
| DE | 19531125 A1 | 2/1997 |
| JP | 10308883 A * | 11/1998 |
| JP | 2000338928 | 12/2000 |

* cited by examiner

*Primary Examiner*—Stephen W Jackson
*Assistant Examiner*—Boris Benenson
(74) *Attorney, Agent, or Firm*—Brinks Hofer Gilson & Lione

(57) ABSTRACT

The present invention provides for a transistor in series with the video input of a video input device prior to the termination resistor. The transistor is utilized due to the large amount of power that would be dissipated across the termination resistor if the video input was inadvertently connected to the automotive battery voltage. For the typical automotive battery of 14 volts, approximately 2.6 watts would be dissipated over the termination resistor likely causing a failure in the video input device. An N channel MOSFET can be used as the switch to provide an extremely low series resistance compared to the 75 ohm termination resistor. This low series resistance minimizes video signal degradation which would be caused by higher impedance switches due to the voltage divider formed by the switch impedance and the 75 ohm termination resistor. An N channel MOSFET also provides fast switching speeds and can be selected to minimize parasitic capacitances such that the video signal is not degraded due to the 75 ohm source impedance.

25 Claims, 1 Drawing Sheet

VIDEO PROTECTION CIRCUIT PROVIDING SHORT TO BATTERY PROTECTION WHILE MAINTAINING TERMINATION IMPEDANCE

BACKGROUND OF THE INVENTION

It is well known in the art of video transmission to use a terminator at the video input device to match the cable impedance thereby reducing electromagnetic interference and signal reflections to improve signal quality. Most composite video cable connections match a 75 ohm impedance cable with a 75 ohm termination resistor in the video input device.

However, a need exists to protect the circuitry of the video input device in the case where an unexpectedly high voltage is connected to the video input circuit. This protection is particularly important in automotive applications where the video input can be inadvertently connected to the automotive battery causing a large amount of power to be dissipated across the termination resistor. Typically, systems utilize a DC blocking capacitor in series with the video input. The DC blocking capacitor has the disadvantage of causing a poor low frequency response which results in either a loss of synchronization or distortions in the video signal.

SUMMARY OF THE INVENTION

In satisfying the above need, as well as overcoming the enumerated drawbacks and other limitations of the related art, the present invention provides for a transistor in series with the video input of a video input device prior to the termination resistor. The transistor is utilized due to the large amount of power that would be dissipated across the termination resistor if the video input was inadvertently connected to the automotive battery voltage. For the typical automotive battery of 14 volts, approximately 2.6 watts would be dissipated by the termination resistor likely causing a failure of the termination resistor and the video input device. An N channel MOSFET is used as a switch to provide an extremely low series resistance compared to the 75 ohm termination resistor. This low series resistance minimizes video signal degradation which would be caused by higher impedance switches due to the voltage divider formed by the switch impedance and the 75 ohm termination resistor. The N channel MOSFET also provides fast switching speeds and can be selected to minimize parasitic capacitances such that the video signal is not degraded due to the 75 ohm source impedance.

Further objects, features and advantages of this invention will become readily apparent to persons skilled in the art after a review of the following description, with reference to the drawings and claims that are appended to and form a part of this specification.

DETAILED DESCRIPTION OF THE PREFERRED EMBODIMENTS

Figure 1:
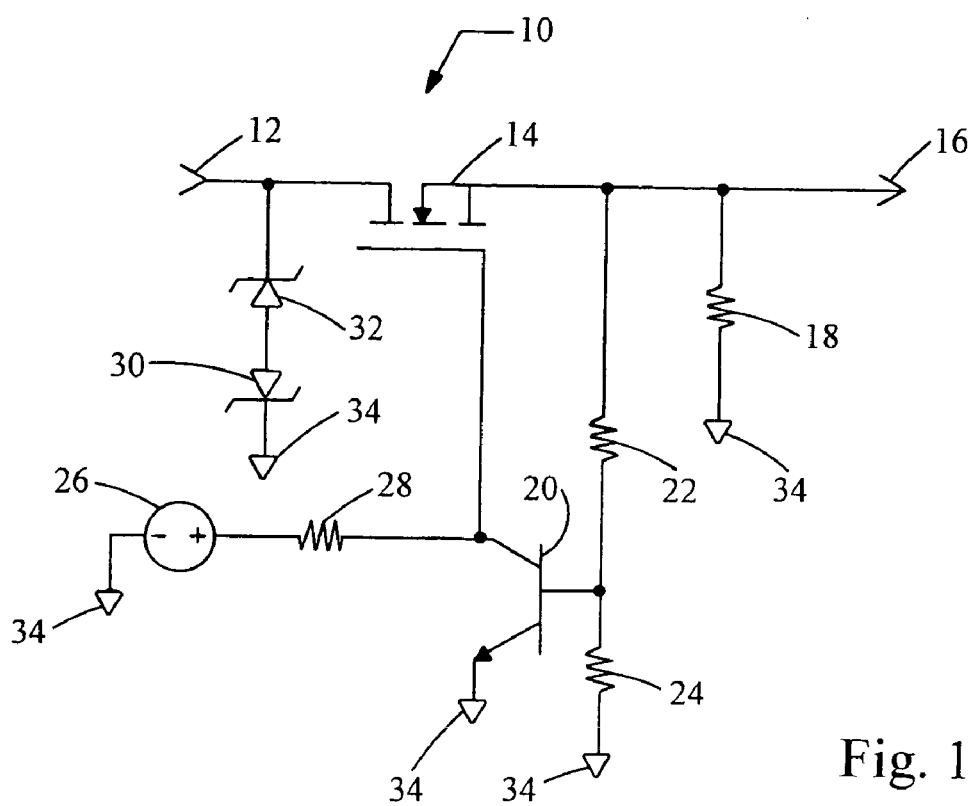
FIG. 1 is a diagrammatic view of a video protection circuit according to the present invention.

Referring now to FIG. 1, a video protection circuit embodying the principles of the present invention is illustrated therein and designated at 10. As its primary components, the video protection circuit 10 includes a video input terminal 12, a transistor 14, and a termination resistor 18.

The video input terminal 12 receives a video signal from a video output device (not shown). The transistor 14, selectively connects the video input terminal 12 with the video circuit 16. The video input terminal 12 is connected to the drain of transistor 14. The source of transistor 14 is connected to both termination resistor 18 and a video circuit 16.

During normal operation transistor 14 connects the video input terminal 12 with the video circuit 16 and the termination resistor 18. Alternatively, if the video input terminal 12 were to be shorted to the automotive battery (not shown), the impedance of transistor 14 is increased to point where the maximum current allowed through transistor 14 is limited such that the voltage on termination resistor 18 is clamped.

Transistor 14, being located between the video input terminal 12 and the termination resistor 18, prevents the dissipation of a large amount of power across the termination resistor 18 in the event the automotive battery (not shown) is inadvertently shorted to the video input terminal 12.

The termination resistor 18 is also connected between the source of transistor 14 and electrical ground 34. The resistance value of the termination resistor 18 is chosen to match the cable impedance, 75 ohms for most video applications, to improve video signal quality.

Preferably, transistor 14 is an N channel MOSFET device. An N channel MOSFET provides an extremely low series resistance, compared to the 75 ohm termination resistor, so that the video signal is not degraded by the voltage divider created by the transistor impedance and the termination resistor 18. An N channel MOSFET device also provides fast switching speeds and can be selected to minimize parasitic capacitances such that the video signal is not degraded due to the 75 ohm source impedance. An example of an N channel MOSFET device is provided by ON Semiconductor of Phoenix, Ariz., part number MMFT960T1.

Such a MOSFET device has a resistance of only 1.7 ohms at the gate drive voltage of 10 volts. In addition, this device has an input capacitance, $C_{iss}$=65 pF. $C_{iss}$ is defined as $C_{gs}+C_{gd}$ with $C_{ds}$ shorted. Where $C_{gs}$ is the capacitance between the gate and source, $C_{gd}$ is the capacitance between the gate in drain, and $C_{ds}$ is the capacitance between the drain and source. Utilizing $C_{iss}$, the frequency response of the circuit can be determined assuming a video source Impedance of the 75 Ohms per Equation 1.

$$f_{-3dB} = \frac{1}{2\pi(75\Omega/2)C_{iss}} = \frac{1}{2\pi(75\Omega/2)65\text{ pF}} = 65.3 \text{ MHz} \qquad \text{Eq. 1}$$

Equation 1 shows that the bandwidth of the circuit will not affect the video signal, which is a bandwidth of approximately 6 Mhz. Further, the MOSFET device can sustain the power dissipation of approximately 400 mW for a post switch control method, such as that shown in FIG. 1.

Another attribute of the protection circuit is that it supports a negative video voltage. A negative video voltage can occur if the driving video source utilizes a DC blocking capacitor. However, the MOSFET device continues to provide a low impedance connection even when the drain is less than zero volts.

A voltage divider including resistor 22 and resistor 24 is also in communication with the source of transistor 14.

Resistor 22 is connected between the source of transistor 14 and the base of transistor 20. Resistor 24 is connected between the base of transistor 20 and an electrical ground 34. The ratio of resistor 22 and resistor 24 determines the voltage required on the source of transistor 14 to activate transistor 20 and the clamp voltage across termination resistor 18.

The emitter of transistor 20 is connected to electrical ground 34 while the collector of transistor 20 is connected to the gate of transistor 14 and connected to voltage source 26 through resistor 28. During normal operation, transistor 20 does not conduct thereby allowing voltage source 26 to activate transistor 14 allowing it to conduct between the video input terminal 12 and the termination resistor 18. In the event the video input terminal 12 is inadvertently connected to the battery voltage, transistor 20 will conduct pulling the voltage on the gate of transistor 14 low. In this configuration, the voltage at the source of transistor 14 is clamped at a predetermined voltage to protect the video circuit. In addition, when the voltage from the voltage source 26 is not present, such as when the video input device is not powered, the transistor 14 is in an "off" state and the video signal can not drive the video circuit thereby providing extra protection.

Electrostatic discharge (ESD) protection can be added using zener diodes 30 and 32 in communication with the video input terminal. The cathode of zener diode 32 is connected to the video input terminal 12 and the anode of zener diode 32 is connected to the anode of zener diode 30. Further, the cathode of zener diode 30 is connected to electrical ground 34 providing a ground path for ESD.

Figure 2:
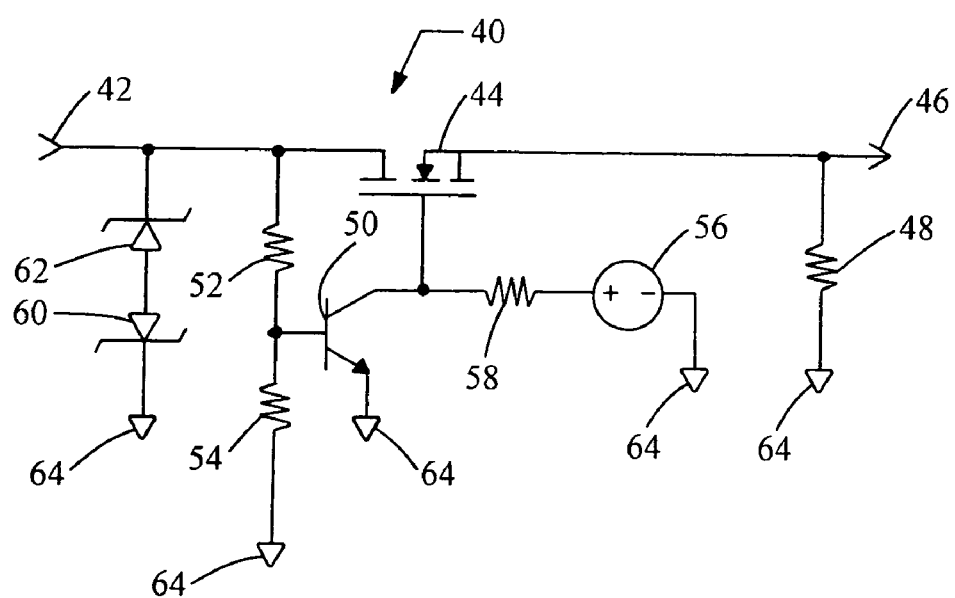
FIG. 2 is a diagrammatic view of another embodiment of a video protection circuit according to the present invention.

Now referring to FIG. 2, another embodiment of a video protection circuit according to the present invention is shown. The video input terminal 42 is connected to the drain of transistor 44. The source of transistor 44 is connected to both termination resistor 48 and a video circuit 46. In this manner, the video input terminal 42 is selectively connected to the video circuit 46 by transistor 44. Transistor 44, being located between the video input terminal 42 and termination resistor 48, prevents the dissipation of a large amount of power across the termination resistor 48 in the event the automotive battery (not shown) is inadvertently shorted to the video input terminal 42. Preferably, transistor 44 is an N channel MOSFET device as discussed earlier in this specification.

The termination resistor 48 is connected between the source of transistor 44 and electrical ground 64. The resistance value of the termination resistor 48 is chosen to match the cable impedance, 75 ohms for most video applications, to improve video signal quality.

A voltage divider including resistor 52 and resistor 54 is also in communication with the drain of transistor 44. Resistor 52 is connected between the drain of transistor 44 in the base of transistor 50. Resistor 54 is connected between the base of transistor 50 and an electrical ground 64. The ratio of resistor 52 and resistor 54 determines the voltage required on the drain of transistor 44 to activate transistor 50.

The emitter of transistor 50 is connected to electrical ground 64. The collector of transistor 50 is connected to the gate of transistor 44 and connected to voltage source 56 through resistor 58. In this configuration, transistor 44 is forced into the off state when a predetermined voltage threshold is exceeded at the video input terminal. In addition, when the voltage from the voltage source 56 is not present, such as when the video input device is not powered, the transistor 44 is in an off state and the video signal can not drive the video circuit thereby providing extra protection.

Electrostatic discharge (ESD) protection can be added using zener diodes 60 and 62 in communication with the video input terminal 42. The cathode of zener diode 62 is connected to the video input terminal 42 and the anode of zener diode 62 is connected to the anode of zener diode 60. Further, the cathode of zener diode 60 is connected to electrical ground 64 providing a ground path for ESD.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. A video input protection circuit connected to a video circuit, the video input protection circuit comprising:
   a video input terminal for receiving a video signal;
   a first transistor in electrical series with the video input terminal;
   a termination resistor in electrical connection with the first transistor, wherein the first transistor is connected between the video input terminal and the termination resistor; and
   a second transistor in electrical communication with the first transistor.

2. The video input protection circuit according to claim 1, wherein the first transistor is configured to limit voltage applied to the termination resistor.

3. The video input protection circuit according to claim 1, wherein the first transistor includes an N channel MOSFET transistor.

4. The video input protection circuit according to claim 1, wherein a drain of the first transistor is connected to the video input terminal and a source of the first transistor is in communication with the termination resistor.

5. The video input protection circuit according to claim 1, wherein a gate of the first transistor is in communication with the second transistor and a power source.

6. The video input protection circuit according to claim 5, further comprising a voltage divider circuit.

7. The video input protection circuit according to claim 6, wherein the voltage divider circuit is connected to the video circuit.

8. The video input protection circuit according to claim 6, wherein the voltage divider circuit is in communication with the second transistor.

9. The video input protection circuit according to claim 8, wherein the voltage divider circuit includes a first and second resistor, the first resistor being connected to the termination resistor on a first end and a base of the second transistor on a second end, the second resistor being connected to a base of the second transistor on a first end and an electrical ground on a second end.

10. The video input circuit according to claim 1, further comprising a first zener diode connected between the video input terminal and an electrical ground.

11. The video input protection circuit according to claim 10, further comprising a second zener diode in electrical series connection with the first the zener diode between the video input terminal and the electrical ground.

12. The video input protection circuit according to claim 11, wherein an anode of the first zener diode is in communication with the video input terminal and the cathode of the first zener diode is in communication with the electrical ground, an anode of the second zener diode is in communication with the electrical ground and the cathode of the second zener diode is in communication with the video input terminal.

13. The video input protection circuit according to claim 1, wherein the second transistor is configured to clamp the voltage of the first transistor.

14. A video input protection circuit connected to a video circuit, the video input protection circuit comprising:
- a video in input terminal for receiving a video signal;
- a N channel MOSFET transistor in electrical series with the video input terminal;
- a termination resistor in electrical connection with the N channel MOSFET, wherein the N channel MOSFET is connected between the video input terminal and the termination resistor; and
- a second transistor in electrical communication with the N channel MOSFET.

15. The video input protection circuit according to claim 14, wherein a drain of the N channel MOSFET transistor is connected to the video input terminal and a source of the N channel MOSFET transistor is in communication with the termination resistor.

16. The video input protection circuit according to claim 14, wherein the N channel MOSFET transistor is configured to limit voltage applied to the termination resistor.

17. The video input protection circuit according to claim 14, wherein a gate of the N channel MOSFET transistor is in communication with the second transistor and a power source.

18. The video input protection circuit according to claim 14, further comprising a voltage divider circuit.

19. The video input protection circuit according to claim 18, wherein the voltage divider is connected to the video circuit.

20. The video input protection circuit according to claim 18, wherein the voltage divider circuit is in communication with the second transistor.

21. The video input protection circuit according to claim 20, wherein the voltage divider circuit includes a first and second resistor, the first resistor being connected to the termination resistor on a first end and a base of the second transistor on a second end, the second resistor being connected to the base of the second transistor on a first end and an electrical ground on a second end.

22. The video input circuit according to claim 14, further comprising a first zener diode connected between the video input terminal and an electrical ground.

23. The video input protection circuit according to claim 22, further comprising a second zener diode in electrical series connection with the first the zener diode between the video input terminal and the electrical ground.

24. The video input protection circuit according to claim 23, wherein an anode of the first zener diode is in communication with the video input terminal and the cathode of the first zener diode is in communication with the electrical ground, an anode of the second zener diode is in communication with the electrical ground and the cathode of the second zener diode is in communication with the video input terminal.

25. The video input protection circuit according to claim 14, wherein the second transistor is configured to clamp the voltage of the N channel MOSFET.

* * * * *

UNITED STATES PATENT AND TRADEMARK OFFICE
CERTIFICATE OF CORRECTION

| | | |
|---|---|---|
| PATENT NO. | : 7,193,828 B2 | Page 1 of 1 |
| APPLICATION NO. | : 10/659836 | |
| DATED | : March 20, 2007 | |
| INVENTOR(S) | : Paul F. L. Weindorf et al. | |

It is certified that error appears in the above-identified patent and that said Letters Patent is hereby corrected as shown below:

In the Claims

Column 5, in claim 14, line 3, before "input terminal for receiving" delete "in".

Signed and Sealed this

Twenty-sixth Day of June, 2007

JON W. DUDAS
*Director of the United States Patent and Trademark Office*